United States Patent
Jattke et al.

(10) Patent No.: US 10,451,689 B2
(45) Date of Patent: Oct. 22, 2019

(54) SPECIFIC ABSORPTION RATE ADJUSTMENT OF SCAN PARAMETERS

(71) Applicants: Kirstin Jattke, Nürnberg (DE); Maria Kröll, Erlangen (DE)

(72) Inventors: Kirstin Jattke, Nürnberg (DE); Maria Kröll, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 245 days.

(21) Appl. No.: 15/455,622

(22) Filed: Mar. 10, 2017

(65) Prior Publication Data

US 2017/0261569 A1    Sep. 14, 2017

(30) Foreign Application Priority Data

Mar. 14, 2016   (DE) .................. 10 2016 204 164

(51) Int. Cl.
*G01V 3/00* (2006.01)
*G01R 33/28* (2006.01)
*G01R 33/54* (2006.01)

(52) U.S. Cl.
CPC ......... *G01R 33/288* (2013.01); *G01R 33/543* (2013.01)

(58) Field of Classification Search
USPC ...................................... 324/309
See application file for complete search history.

(56) References Cited

U.S. PATENT DOCUMENTS

| 6,687,527 | B1* | 2/2004 | Wu | G01R 33/546 324/318 |
|---|---|---|---|---|
| 9,198,598 | B2* | 12/2015 | Kawamura | A61B 5/055 |
| 9,547,053 | B2* | 1/2017 | Bielmeier | G01R 33/32 |
| 2007/0096735 | A1* | 5/2007 | Morich | G01R 33/28 324/318 |
| 2011/0043204 | A1* | 2/2011 | Bielmeier | G01R 33/546 324/307 |
| 2011/0148412 | A1* | 6/2011 | Kanazawa | G01R 33/288 324/309 |
| 2013/0023753 | A1* | 1/2013 | Kawamura | A61B 5/055 600/410 |

(Continued)

OTHER PUBLICATIONS

German Office Action for German Application No. 10 2016 204 164.9, dated Nov. 18, 2016, with English Translation.

*Primary Examiner* — Rodney E Fuller
(74) *Attorney, Agent, or Firm* — Lempia Summerfield Katz LLC

(57) ABSTRACT

A method is provided to prevent a permissible specific absorption rate being exceeded during a magnetic resonance examination and to an evaluation unit. The method includes a first provisioning unit providing a permissible SAR to an evaluation unit. A second provisioning unit, which may be identical to the first provisioning unit, provides a scan protocol for the magnetic resonance examination to the evaluation unit. The evaluation unit checks the scan protocol for the permissible SAR. If this check reveals that the permissible SAR is not adhered to, the scan protocol is modified. In this case, the modification of the scan protocol entails the amendment of at least one scan parameter of the scan protocol. The amendment of the at least one scan parameter is performed in dependence on at least one preference parameter.

19 Claims, 3 Drawing Sheets

(56) References Cited

U.S. PATENT DOCUMENTS

| | | | | |
|---|---|---|---|---|
| 2015/0285885 A1* | 10/2015 | Feiweier | ............ | G01R 33/288 |
| | | | | 324/309 |
| 2015/0301137 A1* | 10/2015 | Keil | ............ | G01R 33/4833 |
| | | | | 324/309 |
| 2016/0091588 A1* | 3/2016 | Benner | ............ | G01R 33/543 |
| | | | | 324/309 |
| 2016/0091590 A1* | 3/2016 | Benner | ............ | G01R 33/56527 |
| | | | | 324/309 |

* cited by examiner

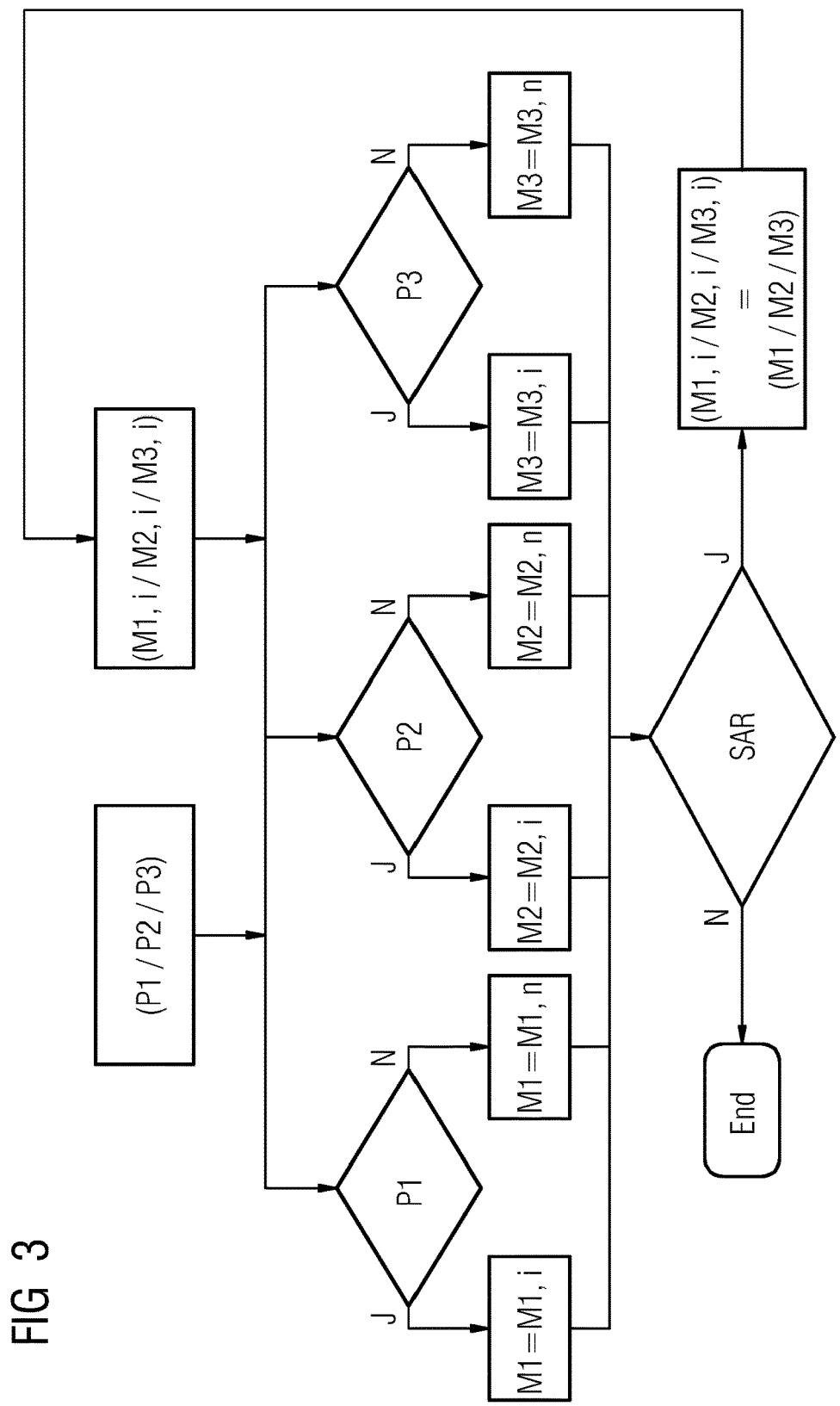

SPECIFIC ABSORPTION RATE ADJUSTMENT OF SCAN PARAMETERS

The application claims the benefit of German Patent Application No. DE 10 2016 204 164.9, filed Mar. 14, 2016, incorporated by reference in its entirety.

TECHNICAL FIELD

The disclosure relates to a method to prevent a permissible specific absorption rate being exceeded during magnetic resonance and to an evaluation unit, a magnetic resonance device, and a computer program product.

BACKGROUND

Magnetic resonance imaging (MRI) is a known technique for generating images of the insides of a body of an examination object. For this purpose, rapidly switched gradient pulses may be superimposed onto a static basic magnetic field in a magnetic resonance device during a magnetic resonance examination. Moreover, in order to initiate magnetic resonance signals, radio-frequency excitation pulses (RF pulses) are irradiated into the examination object. The energy of the RF pulses that may be absorbed per time unit and per kilogram of body weight may be termed the specific absorption rate (SAR). Absorption of the RF energy may result in heating of the body tissue. This is an important variable for creating safety thresholds. In the case of an impermissibly high local concentration of RF energy, RF burns may occur. In the case of uniform distribution of the RF energy throughout the whole body, the stress on the patient's thermoregulation or cardiovascular system is the decisive factor.

Consequently, measures need to be taken to prevent a permissible SAR being exceeded. The disclosure is based on providing an efficient method for preventing the SAR from being exceeded.

SUMMARY AND DESCRIPTION

The scope of the present disclosure is defined solely by the appended claims and is not affected to any degree by the statements within this description. The present embodiments may obviate one or more of the drawbacks or limitations in the related art.

The disclosure provides a method to prevent a permissible SAR being exceeded during a magnetic resonance examination. The method includes a first provisioning unit providing the permissible SAR to an evaluation unit. A second provisioning unit, which may be identical to the first provisioning unit, provides a scan protocol of the magnetic resonance examination to the evaluation unit. The evaluation unit checks the scan protocol with respect the permissible SAR. If this check reveals that the permissible SAR is not adhered to, the scan protocol is modified. In this case, the modification of the scan protocol entails the amendment of at least one scan parameter of the scan protocol. The amendment of the at least one scan parameter is performed in dependence on at least one preference parameter.

The permissible SAR may be described with one or more limit values. Therefore, the check for the permissible SAR advantageously controls whether the SAR remains below these limit values during the magnetic resonance examination.

A scan protocol may include a set of scan parameters. These scan parameters may be used to derive a pulse sequence, e.g., a temporal sequence of RF pulses and gradient pulses for the excitation of an image volume to be scanned, for signal generation and spatial encoding. The scan parameters and/or pulse sequence may be used to set different contrasts such as, for example, T1-, T2-, or susceptibility weighting. In addition, it is also possible to set the field of view (FoV), resolution, and slice thickness.

Taking account of the at least one preference parameter enables the scan protocol to be adjusted well to individual requirements and preferences.

The amendment of the at least one scan parameter may be performed automatically. The scan protocol is advantageously adjusted by an amendment to a plurality of scan parameters, e.g., the best combination of SAR-critical scan parameters is determined. This avoids the possibility of a possible amendment of only one scan parameter producing suboptimal scan results. Moreover, an operator does not have to intervene manually in the scan parameters according to a trial-and-error method, but is able swiftly to proceed with the magnetic resonance examination. In addition, apart from the time saved, the operator does not have to cope with any technical restrictions of the magnetic resonance device.

The at least one scan parameter, which may be modified in the context of the suggested method, may be a repetition time (TR), a flip angle (FA), a slice number, a gradient property, or a combination thereof. These scan parameters are suitable because they enable the SAR to be influenced effectively. For example, an increase in the repetition time, a reduction of the flip angle, (for example, from 120° to 70°), fewer slices, or a combination thereof may reduce the SAR.

The at least one preference parameter may depict a preference with respect to an image quality, a scan time, a scan coverage, or a combination thereof. The preference parameter may indicate whether an aspect of the magnetic resonance examination assigned to the preference is important and/or how important it is. These preferences are suitable because they enable good adjustment to individual preferences and the scan parameters associated therewith exert a high influence on the SAR.

For example, it is conceivable for the SAR to be reduced to the detriment of the image quality, (e.g., the image contrast), by reducing the flip angle. If, for example, on the other hand, there is a preference for the image quality to be important, there will be no reduction, or only a small reduction, of the flip angle.

It is further conceivable for the SAR to be reduced by an increase in the repetition time. However, as a rule, this would result in a higher scan time. If, for example, a short scan time is sought, there will be no increase, or only a small increase, in the repetition time.

A further possibility for reducing the SAR includes a reduction of the number of slices to be acquired. This results in lower scan coverage of the examination object and so, in the case of a preference according to which coverage is important, this measure may be given less consideration or even not considered at all.

One embodiment provides that the at least one preference parameter includes a plurality of preference parameters, wherein the plurality of preference parameters are weighted relative to one another.

For example, it is conceivable for a plurality of preferences to be specified but which are not equally important. In an embodiment, the image quality is of high importance, high scan coverage of medium importance, and a short scan time of low importance. To reduce the SAR, the scan parameters are adjusted at the expense of the scan time, for example, with an increase in the repetition time, in a further instance at the expense of the scan coverage, for example, with a reduction of the slice number. In this case, measures at the expense of the image quality, for example, the reduction of the flip angle, may be avoided.

One embodiment provides that the at least one preference parameter is at least partially specified after the scan protocol has been checked.

Hence, it is possible, in the context of a magnetic resonance examination for the at least one preference parameter to be specified, for the specific problem to be investigated in the respective magnetic resonance examination.

In this case, an operator sets the at least one preference parameter. Furthermore, the operator may weight a plurality of preference parameters relative to one another.

A further embodiment provides that the at least one preference parameter is at least partially stored. The at least one preference parameter may be stored in the scan protocol and/or in a database.

The preferences are frequently already clear at the time at which the scan protocol is compiled. Therefore, the at least one preference parameter may also be saved as a protocol parameter and is hence stored. If the scan protocol is to be implemented and if the SAR is exceeded, there is no need for manual intervention on the part of the operator. Instead it is possible for the at least one preference parameter stored in the protocol to be used directly as the basis of a solution strategy to prevent the SAR being exceeded. This may increase the efficiency of the sequence of operation of a magnetic resonance examination because the output of a warning that the SAR is exceeded and/or the specification of measures to prevent the SAR from being exceeded may be avoided.

It is also conceivable for information on the modification of the scan protocol to be output. For example, it is possible for the operator be notified of any amendments made. However, it is also possible for the recording of scanning data to start directly without requiring an interaction by the operator in response to this notification.

Also conceivable is a combination of stored preference parameters and preference parameters that are specified after the scan protocol has been checked.

Also suggested is an evaluation unit configured to check a scan protocol with respect to adherence to a permissible SAR.

Also suggested is a magnetic resonance device with a first provisioning unit, a second provisioning unit, and an evaluation unit. In this case, the first provisioning unit is configured to provide a permissible SAR to an evaluation unit. The second provisioning unit is configured to provide a scan protocol of the magnetic resonance examination to the evaluation unit. The second provisioning unit may be identical to the first provisioning unit and/or included within a common provisioning unit. The evaluation unit is configured to check the scan protocol with respect to adherence to the permissible SAR.

The advantages of the evaluation unit and the magnetic resonance device substantially correspond to the advantages of the method to prevent a permissible specific absorption rate being exceeded during a magnetic resonance examination as described in detail above. Any features, advantages or alternative embodiments mentioned here, may also be transferred to the other claimed subject matter and vice versa.

Also suggested is a computer program product including a program and that may be loaded directly into a memory of a programmable computing unit of the evaluation unit and program units, for example, libraries and auxiliary functions, in order to prevent a permissible specific absorption rate being exceeded during a magnetic resonance examination when the computer program product is executed in the evaluation unit. In this case, the computer program may comprise software with a source code, which still has to be compiled and linked or only has to be interpreted, or an executable software code, which only needs to be loaded into the computing unit or control device for execution. The computer program product may carry out the method for preventing a permissible specific absorption rate being exceeded quickly, identically repeatedly, and robustly. The computer program product is configured such that it may carry out the acts of the method by the evaluation unit. In this case, the evaluation unit fulfills the conditions such as, for example, have an appropriate working memory, an appropriate graphics card, or an appropriate logic unit so that the respective method acts may be carried out efficiently.

The computer program product is, for example, stored on a computer-readable medium or on a network or server from where it may be loaded into the processor. It is also possible for control information of the computer program product to be stored on an electronically readable data medium. The control information of the electronically readable data medium may be configured such that it carries out a method when the data medium is used. Examples of electronically readable data media include a DVD, a magnetic tape, or a USB stick on which electronically readable control information, e.g., software, is stored. When this control information is read from the data medium, all the embodiments of the above-described method may be performed. Hence, the disclosure may also be based on said computer-readable medium and/or said electronically readable data medium.

BRIEF DESCRIPTION OF THE DRAWINGS

Further advantages, features, and details of the disclosure may be derived from the embodiments described below and with reference to the drawings.

FIG. 3 depicts a flow diagram of an algorithm for the modification of a scan protocol according to an embodiment.

DETAILED DESCRIPTION

Figure 1:
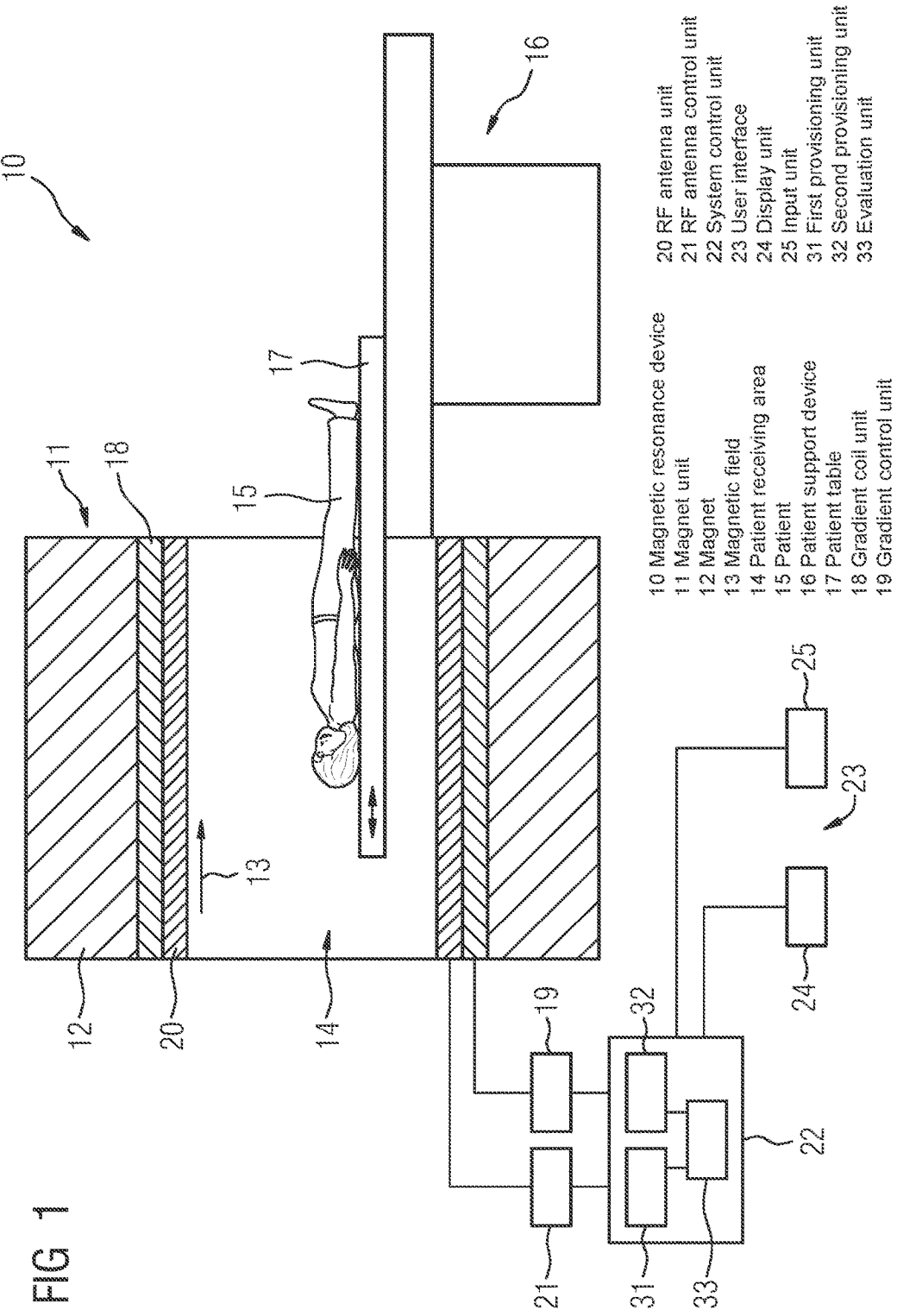
FIG. 1 depicts a schematic representation of a magnetic resonance device with an evaluation unit according to an embodiment.

FIG. 1 is a schematic representation of a magnetic resonance device 10. The magnetic resonance device 10 includes a magnet unit 11 with a superconducting basic magnet 12 to generate a strong, and, e.g., temporally constant, basic magnetic field 13. The magnetic resonance device 10 also includes a patient receiving area 14 for receiving a patient 15. In the present embodiment, the patient receiving area 14 has a cylindrical shape and is surrounded in a circumferential direction by the magnet unit 11. However, in principle an embodiment of the patient receiving area 14 deviating therefrom is conceivable at any time. The patient 15 may be pushed into the patient receiving area 14 by a patient support device 16 of the magnetic resonance device 10. To this end, the patient support device 16 includes a patient table 17 configured to be movable within the patient receiving area 14.

The magnet unit 11 further includes a gradient coil unit 18 for the generation for the generation of magnetic field gradients, which are used for spatial encoding during imaging. The gradient coil unit 18 is controlled by a gradient control unit 19 of the magnetic resonance device 10. The gradient coil unit 19 includes three gradient coils, which are not depicted in detail here. The magnet unit 11 further includes a radio-frequency antenna unit 20, which in the present embodiment is configured as a body coil permanently integrated in the magnetic resonance device 10. The radio-frequency antenna unit 20 is designed to use RF pulses to excite atomic nuclei that become established in the basic magnetic field 13 generated by the basic magnet 12. The radio-frequency antenna unit 20 is controlled by a radio-frequency antenna control unit 21 of the magnetic resonance device 10 and emits radio-frequency magnetic resonance sequences into an examination chamber substantially formed by a patient receiving area 14 of the magnetic resonance device 10. The radio-frequency antenna unit 20 is also configured to receive magnetic resonance signals.

The magnetic resonance device 10 includes a system control unit 22 to control the basic magnet 12, the gradient control unit 19, and the radio-frequency antenna control unit 21. The system control unit 22 controls the magnetic resonance device 10 centrally, e.g., for the performance of a predetermined imaging pulse sequence in accordance with a scan protocol. The system control unit 22 also includes a reconstruction unit, which is not depicted in further detail here, for the reconstruction of medical image data acquired during the magnetic resonance examination. The magnetic resonance device 10 also includes a user interface 23 connected to the system control unit 22. Control information such as, imaging parameters and reconstructed magnetic resonance images may be displayed on a display unit 24, for example, on at least one monitor, of the user interface 23 for a medical operator. The user interface 23 also includes an input unit 25 by which the medical operator may input information and/or parameters during a scanning process.

The magnetic resonance device 10 further includes a first provisioning unit 31, a second provisioning unit 32, and an evaluation unit 33. Here, the first provisioning unit 31 is configured to provide a permissible SAR to an evaluation unit 33. The second provisioning unit 32 is configured to provide a scan protocol of the magnetic resonance examination to the evaluation unit 33 and the evaluation unit 33 is configured to check the scan protocol with respect to adherence to the permissible SAR.

In this example, like the provisioning units 31, 32, the evaluation unit 33 is included in the system control unit 22 of the magnetic resonance device 10. However, it is also conceivable for the evaluation unit 33 to be configured as an external unit operated independently of the magnetic resonance device 10.

The evaluation unit 33 includes a computing unit, which is not depicted in further detail here, including, for example, one or more processors and/or a memory for carrying out a method to prevent a permissible specific absorption rate being exceeded during a magnetic resonance examination. A program may be loaded into the memory of the programmable computing unit in order to carry out a corresponding method when the program is executed in the computing unit.

Figure 2:
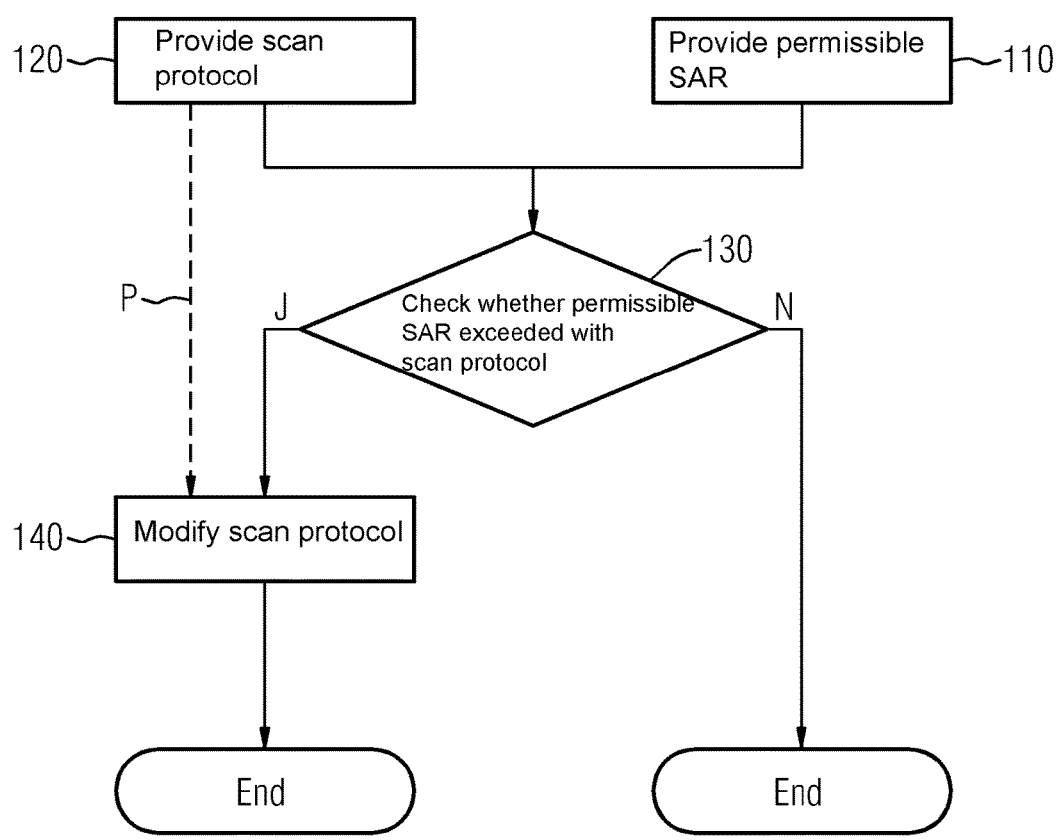
FIG. 2 depicts a block diagram of a method according to an embodiment.

One possible embodiment of a method of this kind to prevent a permissible specific absorption rate being exceeded during a magnetic resonance examination is depicted as a block diagram in FIG. 2. In act 110, a permissible SAR is provided by a first provisioning unit 31 to the evaluation unit 33. For example, the permissible SAR may be stored in a database to which the evaluation unit 33 has access.

In act 120, a scan protocol of the magnetic resonance examination is provided to the evaluation unit 33 by a second provisioning unit 32. The scan protocol may be selected and/or specified in advance by an operator, for example, with the aid of a user interface 23. The scan protocol may include at least one scan parameter, for example, a repetition time (TR), a flip angle (FA), a slice number, a gradient property, or a combination thereof.

In act 130, the evaluation unit 33 checks whether the implementation of the scan protocol with its original scan parameters would result in the permissible SAR being exceeded (e.g., corresponding to the reference character J in FIG. 2), or whether the permissible SAR is adhered to (e.g., corresponding to the reference character N in FIG. 2). If this check 130 reveals that the permissible SAR is not adhered to, the scan protocol is modified in act 140, e.g., at least one scan parameter of the scan protocol is amended. In this case, the amendment of the at least one scan parameter is dependent on at least one preference parameter.

The amendment of the scan parameters in act 140 advantageously takes place such that the evaluation unit 33 uses algorithms to calculate the best combination of SAR-critical scan parameters.

By way of example, FIG. 3 depicts an algorithm. Here, this depicts three preference parameters P1, P2, and P3, which together form a set of preference parameters (P1/P2/P3). The three preference parameters may, for example, depict preferences with respect to high image quality, short scan time, and high scan coverage. The scan protocol further includes three original scan parameters $M1,i$, $M2,i$, and $M3,i$. These are intended, by way of example, to characterize a repetition time, a flip angle, and a slice number.

For purposes of simplification, in this example, it is assumed that each scan parameter only influences one preference. For example, depending on how the scan parameter $M1,i$ is specified, the preference P1 is taken into account to a greater or lesser extent; and depending on how the scan parameter $M2,i$ is specified, the preference P2 is taken into account to a greater or lesser extent, etc. For example, here a scan parameter is assigned to a preference.

For example, consideration may be paid to the preference "high image quality" with a suitable setting of the scan parameter "flip angle." The same applies to the preference "short scan time" and the scan parameter "repetition time" and the preference "high scan coverage" and the scan parameter "slice number."

If, for example, it is specified that the corresponding preference is important (e.g., corresponding to the reference character J with the branches P1, P2, P3 in FIG. 3), the scan parameter M1 is not amended compared to the original scan parameter $M1,i$ so that $M1=M1,i$. If, on the other hand, it is specified that the corresponding preference is not important (e.g., corresponding to the reference character N with the branches P1, P2, P3 in FIG. 3), the scan parameter M1 is amended to $M1,n$ in order to reduce the SAR, e.g., $M1=M1,n$. The preference parameter for a preference may, therefore, be a bivalent, Boolean variable, which may only be assigned the values "important" or "not important." Depending upon this value, it may be provided that the scan parameter, which is assigned to the respective preference, is amended or not amended.

The preferences P2 and P3 are treated similarly, so that after these acts a new set of scan parameters (M1/M2/M3) is generated. A check is performed as to whether the permissible SAR is still exceeded with the new scan parameters. If this is still the case (e.g., corresponding to the reference character J with the branch SAR), the algorithm is repeated with new original scan parameters (M1,i/M2,i/M3,i)=(M1/M2/M3). This enables it to be provided that the amendment of the scan parameters is performed in dependence on the preference parameters.

In order to specify the preference parameters, it is, for example, possible for a choice of different preferences to be displayed to the operator on the display unit 24. The operator may use these to make a clinical preselection, which, for example, contains the shortest possible scan time or gives priority to the image quality.

These preference parameters may be weighted relative to one another. For example, a short scan time is important compared to a high scan coverage, while a high image quality is more important than a high scan coverage but less important than a short scan time. The different preferences may also be ordered in sequence with respect to their relevance. This may once again be performed with the aid of the user interface 23. Hence, the amendment of the scan parameters may be graded more efficiently.

It is also conceivable for the at least one preference parameter to be at least partially stored. For example, preferences may be saved as preference parameters in the scan protocol. If the scan protocol is implemented and it is then determined in act 130 that the SAR is exceeded, it is then not necessary for a dialog for the definition of preference parameters to be processed in the user interface 23, instead it is possible for the solution strategy stored in the scan protocol to be used directly. The provision of the preference parameters from the scan protocol is indicated in FIG. 2 by the arrow P.

The operator may be displayed information on the performed on the display unit 23. However, this may not necessarily stop scanning data being recorded.

Finally, reference is made once again to the fact that the method described in detail above and the evaluation unit and magnetic resonance device described are only embodiments that may be modified by the person skilled in the art in a wide variety of ways without departing from the scope of protection of the disclosure. Furthermore, the use of indefinite article "a" or "an" does not preclude the possibility of the features in question also being present on a multiple basis. Similarly, the use of the term "unit" does not preclude the possibility of the components in question including a plurality of interacting part-components that may also be spatially separated from one another.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for preventing a permissible specific absorption rate (SAR) from being exceeded during a magnetic resonance imaging examination, the method comprising:
   providing, by a first provisioning unit, the permissible SAR to an evaluation unit;
   providing, by a second provisioning unit, a scan protocol for the magnetic resonance imaging examination to the evaluation unit;
   checking, by the evaluation unit, the scan protocol for the permissible SAR; and
   modifying the scan protocol when the checking reveals that the permissible SAR is not adhered to,
   wherein the modification of the scan protocol comprises amending at least one scan parameter of the scan protocol,
   wherein the at least one scan parameter comprises a repetition time, a flip angle, a slice number, a gradient property, or a combination thereof,
   wherein the amendment of the at least one scan parameter is performed in dependence on at least one preference parameter, and
   wherein the at least one preference parameter is a preference with respect to an image quality, a scan time, a scan coverage, or a combination thereof.

2. The method of claim 1, wherein the at least one scan parameter is the repetition time.

3. The method of claim 2, wherein the at least one preference parameter comprises a plurality of preference parameters, the plurality of preference parameters being weighted relative to one another.

4. The method of claim 1, wherein the at least one preference parameter is a preference with respect to the image quality.

5. The method of claim 1, wherein the at least one preference parameter is a preference with respect to the scan time.

6. The method of claim 1, wherein the at least one preference parameter comprises a plurality of preference parameters, the plurality of preference parameters being weighted relative to one another.

7. The method of claim 1, wherein the at least one preference parameter is at least partially specified after the scan protocol has been checked.

8. The method of claim 7, wherein an operator sets the at least one preference parameter, weights a plurality of preference parameters, or sets the at least one preference parameter and weights the plurality of preference parameters relative to one another.

9. The method of claim 1, wherein the at least one preference parameter is at least partially stored.

10. The method as claimed of claim 1, wherein the at least one preference parameter is stored partially in the scan protocol, in a database, or in the scan protocol and in the database.

11. The method of claim 1, further comprising:
   outputting information on the modification of the scan protocol.

12. The method of claim 1, wherein the at least one scan parameter is the flip angle.

13. The method of claim 1, wherein the at least one scan parameter is the slice number.

14. The method of claim 1, wherein the at least one scan parameter is the gradient property.

15. The method of claim 1, wherein the at least one preference parameter is a preference with respect to the scan coverage.

16. An evaluation unit comprising:
a processor configured to:
- check a scan protocol with respect to adherence to a permissible specific absorption rate (SAR) for a magnetic resonance imaging examination; and
- modify the scan protocol when the check of the scan protocol reveals that the permissible SAR is not adhered to,
- wherein the modification of the scan protocol comprises amending at least one scan parameter of the scan protocol,
- wherein the at least one scan parameter comprises a repetition time, a flip angle, a slice number, a gradient property, or a combination thereof,
- wherein the amendment of the at least one scan parameter is performed in dependence on at least one preference parameter, and
- wherein the at least one preference parameter is a preference with respect to an image quality, a scan time, a scan coverage, or a combination thereof.

17. A magnetic resonance imaging device comprising:
an evaluation unit;
a first provisioning unit configured to provide a permissible specific absorption rate (SAR) to the evaluation unit; and
a second provisioning unit configured to provide a scan protocol for a magnetic resonance imaging examination to the evaluation unit,
wherein the evaluation unit is configured to check the scan protocol with respect to adherence to the permissible SAR,
wherein the evaluation unit is configured to modify the scan protocol when the check of the scan protocol reveals that the permissible SAR is not adhered to, and
wherein the modification of the scan protocol comprises amending at least one scan parameter of the scan protocol,
wherein the at least one scan parameter comprises a repetition time, a flip angle, a slice number, a gradient property, or a combination thereof,
wherein the amendment of the at least one scan parameter is performed in dependence on at least one preference parameter, and
wherein the at least one preference parameter is a preference with respect to an image quality, a scan time, a scan coverage, or a combination thereof.

18. The magnetic resonance imaging device of claim 17, wherein the magnetic resonance imaging device is configured to output information on the modification of the scan protocol.

19. An evaluation unit comprising:
a memory;
a computer program loaded in the memory of a computing unit of an evaluation unit, wherein the computer program is configured to cause the evaluation unit to:
receive a permissible specific absorption rate (SAR);
receive a scan protocol for a magnetic resonance imaging examination;
check the scan protocol for the permissible SAR; and
modify the scan protocol when the check reveals that the permissible SAR is not adhered to,
wherein the modification of the scan protocol comprises amending at least one scan parameter of the scan protocol,
wherein the at least one scan parameter comprises a repetition time, a flip angle, a slice number, a gradient property, or a combination thereof,
wherein the amendment of the at least one scan parameter is performed in dependence on at least one preference parameter, and
wherein the at least one preference parameter is a preference with respect to an image quality, a scan time, a scan coverage, or a combination thereof.

* * * * *